US012593415B2

(12) United States Patent
    Chang

(10) Patent No.:     US 12,593,415 B2
(45) Date of Patent:        Mar. 31, 2026

(54) LOCKING MECHANISM AND ELECTRONIC DEVICE MODULE HAVING THE SAME

(71) Applicant: Fulian Precision Electronics (Tianjin) Co., LTD., Tianjin (CN)

(72) Inventor: En-Chieh Chang, New Taipei (TW)

(73) Assignee: Fulian Precision Electronics (Tianjin) Co., LTD., Tianjin (CN)

( * ) Notice:     Subject to any disclaimer, the term of this patent is extended or adjusted under 35 U.S.C. 154(b) by 126 days.

(21) Appl. No.: 18/777,546

(22) Filed:     Jul. 19, 2024

(65)         Prior Publication Data

US 2025/0056742 A1     Feb. 13, 2025

(30)         Foreign Application Priority Data

Aug. 11, 2023     (CN) ......................... 202311015367.6

(51) Int. Cl.
    *H05K 5/02*          (2006.01)
(52) U.S. Cl.
    CPC ................................. *H05K 5/0221* (2013.01)
(58) Field of Classification Search
    None
    See application file for complete search history.

(56)              References Cited

U.S. PATENT DOCUMENTS 10,803,907 B2 *  10/2020  Schroeder ............ G11B 33/128
2016/0302322 A1 *  10/2016  Chen .................... G11B 33/124

FOREIGN PATENT DOCUMENTS

TW            201044951 A      12/2010

* cited by examiner

*Primary Examiner* — Kenneth Bukowski
(74) *Attorney, Agent, or Firm* — ScienBiziP, P.C.

(57)            ABSTRACT

A locking mechanism can assemble a body to a rack. The locking mechanism includes a housing and a linkage assembly. The housing includes a first member and a second member. The linkage assembly is installed on the housing, the linkage assembly includes a rotating member, an operating member, and a locking assembly. The operating member and the locking assembly are disposed in the rotating member. The locking assembly can be clamped with the second member, thereby securing the linkage assembly to the rack. Wherein the operating member can rotate, thereby causing the linkage assembly to move away from the second member and be detached from the second member. The operating member further can rotate and drive the rotating member rotate, thereby causing the rotating member to detach from the rack. The present disclosure further provides an electronic device module.

18 Claims, 12 Drawing Sheets

LOCKING MECHANISM AND ELECTRONIC DEVICE MODULE HAVING THE SAME

FIELD

The subject matter herein generally relates to a locking mechanism and an electronic device module having the locking mechanism.

BACKGROUND

A server can be detachably installed on the rack through a locking mechanism. However, the process of removing the server from the rack may be cumbersome. Therefore, there is a room for improvement in the art.

BRIEF DESCRIPTION OF THE DRAWINGS

Implementations of the present technology will now be described, by way of example only, with reference to the attached figures.

DETAILED DESCRIPTION

Figure 1:
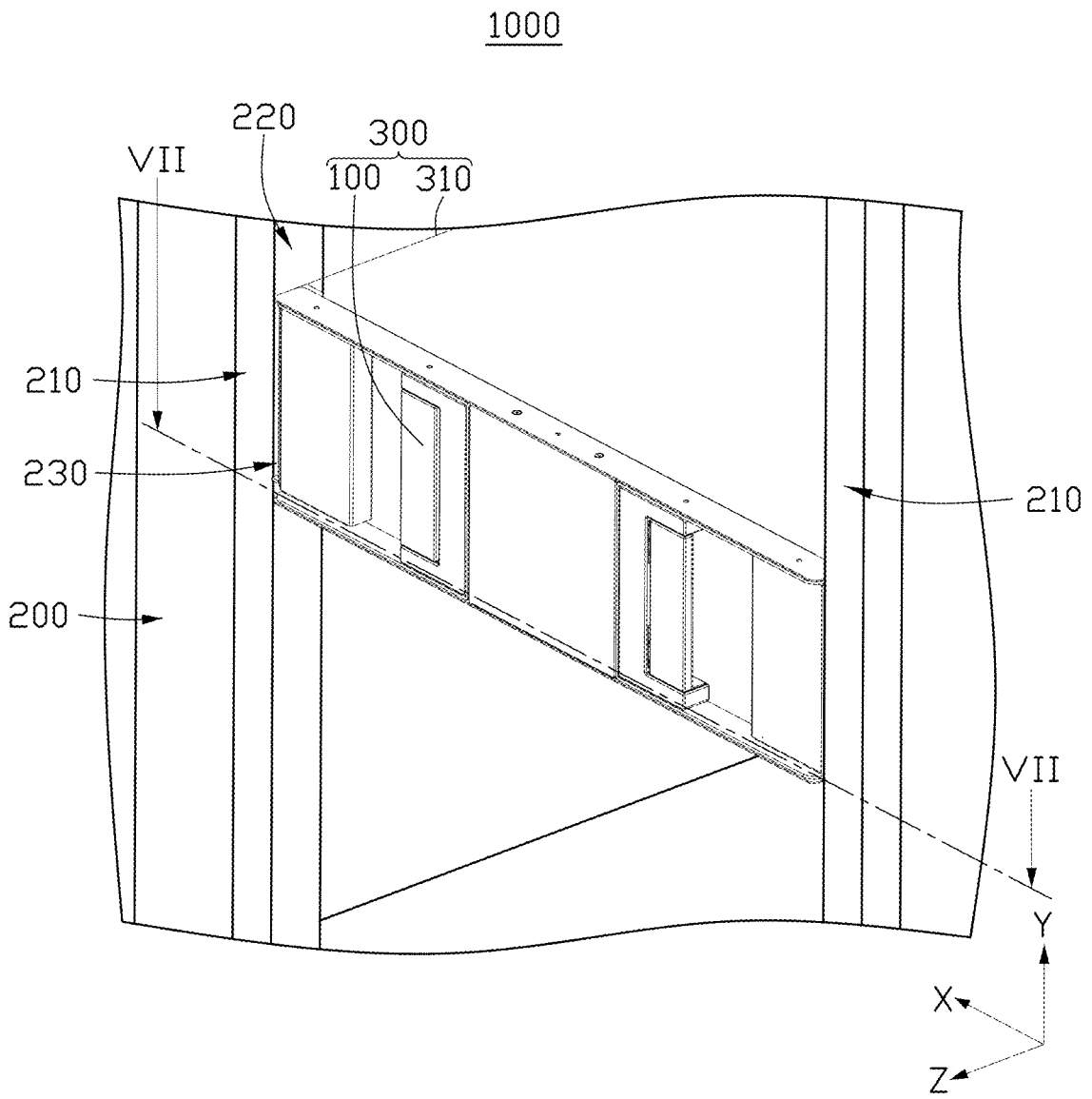
FIG. 1 is a diagrammatic view of an embodiment of a locking mechanism installed on a rack according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Some embodiments of the present disclosure will be described in detail with reference to the drawings. If no conflict, the following embodiments and features in the embodiments can be combined with each other.

Figure 2:
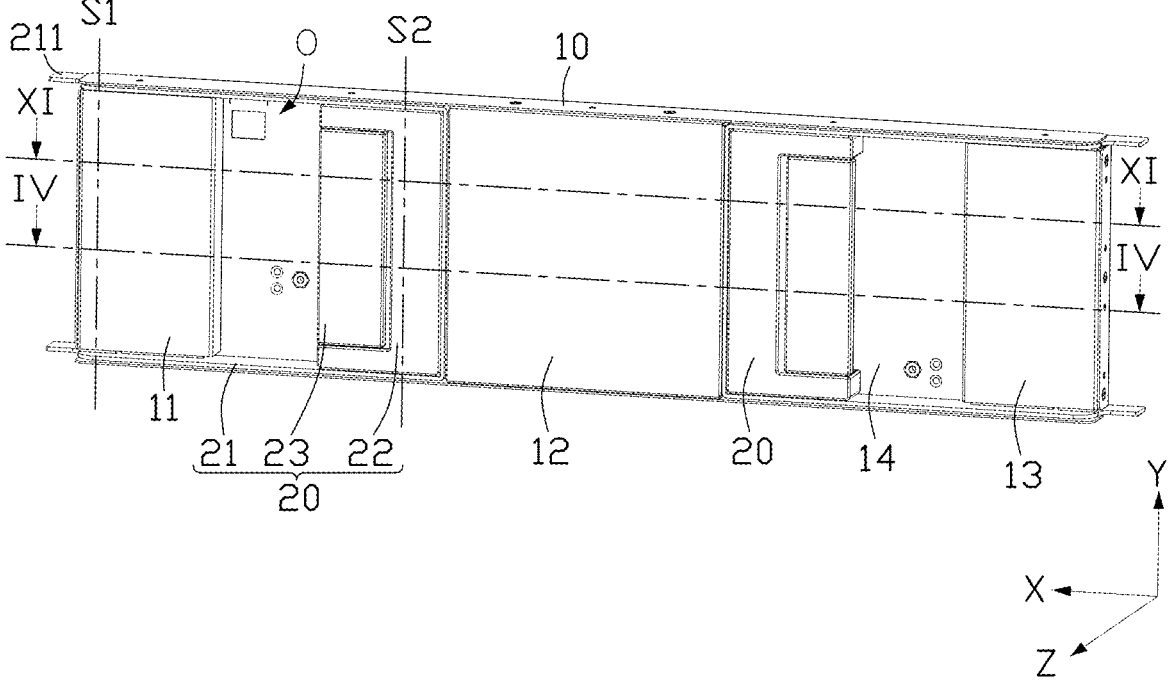
FIG. 2 is a diagrammatic view of a linkage assembly of the locking mechanism in FIG. 1, wherein the linkage assembly is locked to a second member.

Referring to FIGS. 1 and 2, an electronic device module 1000 is provided according to an embodiment of the present disclosure. The electronic device module 1000 includes a rack 200 and at least one electronic device 300 fixed to the rack 200. The electronic device 300 includes a body 310 and a locking mechanism 100 fixed to the body. The electronic device can be detachably clamped to the rack 200 through the locking mechanism 100. The body can be a server, a hard disk, or the like. The locking mechanism 100 includes a housing 10 and a linkage assembly 20. The linkage assembly 20 is mounted on the housing 10, and the body is connected to the housing 10. The linkage assembly 20 can be detachably mount the housing 10 on the rack 200.

Figure 3:
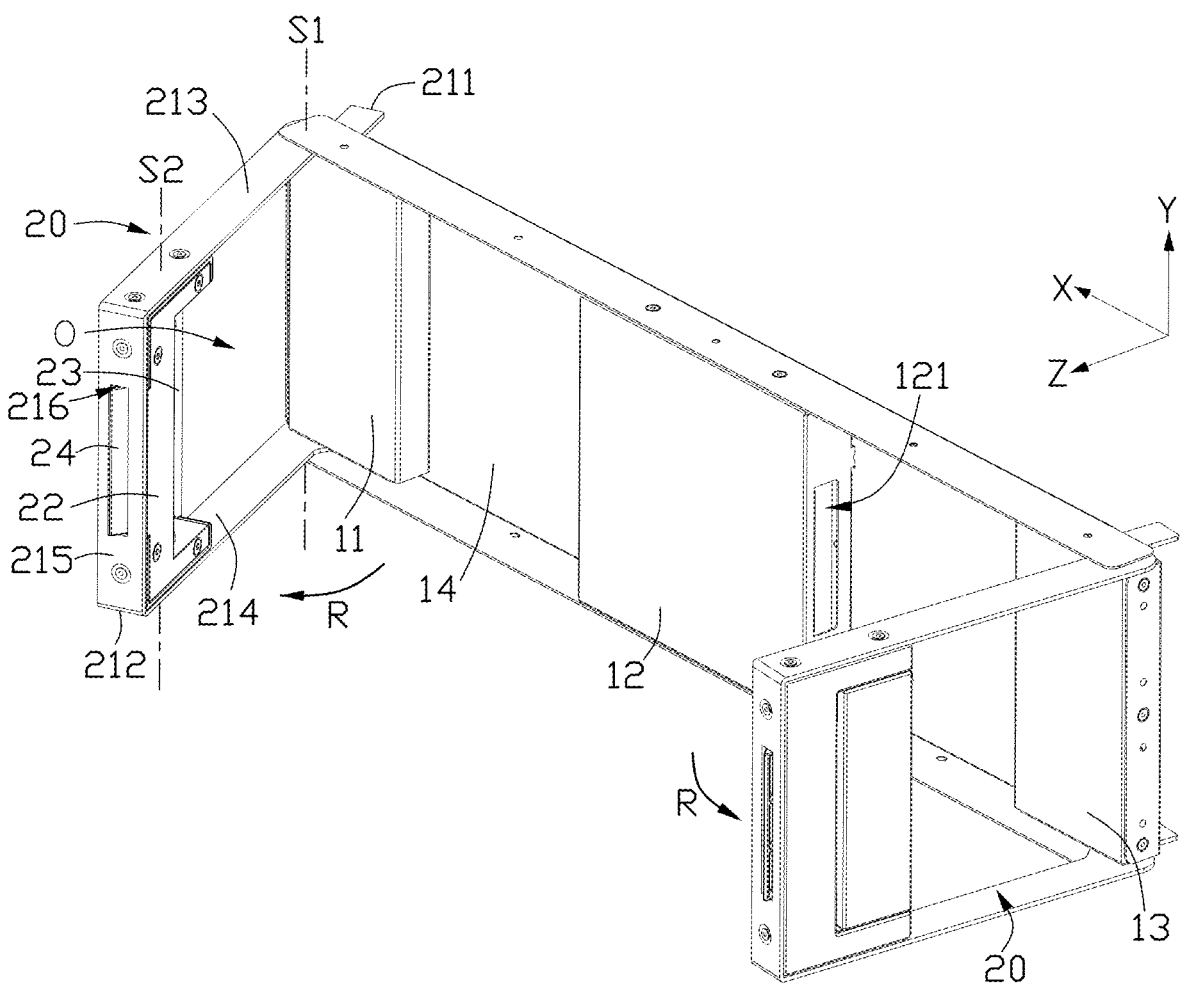
FIG. 3 is a diagrammatic view of the linkage assembly of the locking mechanism of FIG. 2, wherein the linkage assembly is detached from the second member.
Figure 4:
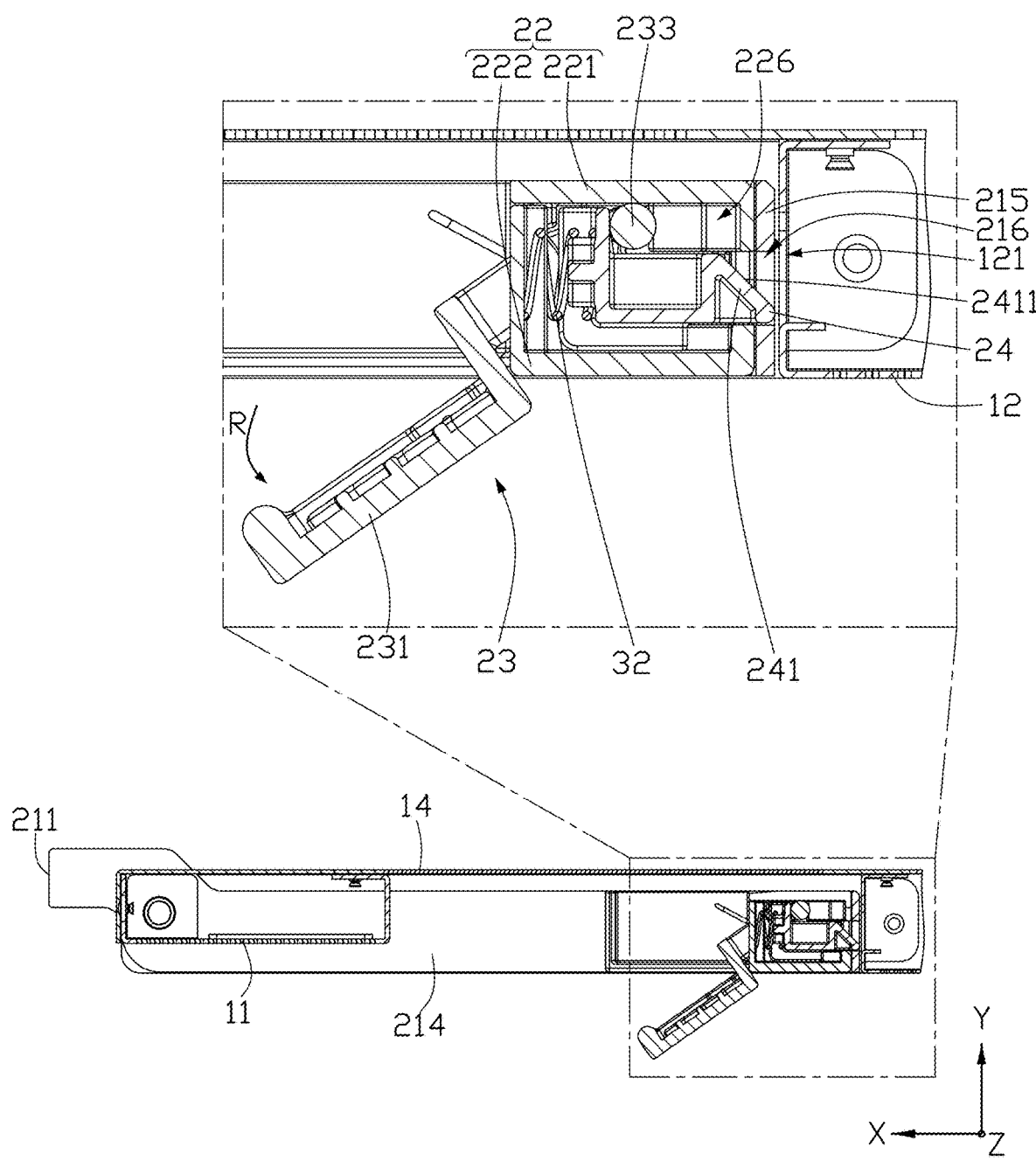
FIG. 4 is a cross-sectional view taken along line IV-IV of FIG. 2.

Referring to FIGS. 3 and 4, the housing 10 includes a first member 11 and a second member 12 connected to the first member 11. The first member 11 and the second member 12 are disposed side by side along a first direction X. The linkage assembly 20 includes a rotating member 21, a fixing member 22, an operating member 23, and a locking assembly 24. The rotating member 21 is hollow and defines an accommodating space O. The fixing member 22, the operating member 23, and the locking assembly 24 are disposed in the accommodating space O.

The rotating member 21 includes a first end 211 and a second end 212 opposite to the first end 211. The first end 211 is rotatably connected to the first member 11 and is clamped with the rack 200. The rotating member 21 can rotate around the first end 211. When the rotating member 21 is not rotated, the rotating member 21 can be disposed on the housing 10 and parallel to the housing 10; when the rotating member 21 rotates around the first end 211, the rotating member 21 is disposed at an angle with the housing 10.

When the rotating member 21 is locked onto the second member 12, the second end 212 towards the first end 211 is disposed along the first direction X. The fixing member 22 is mounted on the second end 212. The locking assembly 24 is mounted on the fixing member 22. When the rotating member 21 is not rotated, the locking assembly 24 faces the second member 12 (as shown in FIG. 2). The second end 212 defines a through hole 216 for accommodating a portion of the locking assembly 24. When the linkage assembly 20 is locked onto the rack 200, the locking assembly 24 passes through the through hole 216 and locked onto the second member 12. The operating member 23 is rotatably connected to the fixing member 22, a rotational axis S2 of the operating member 23 parallel to a rotational axis S1 of the rotating member 21. Referring to FIG. 3, a side of the operating member 23 facing the first member 11 can flip around a rotating direction R, thereby driving the locking assembly 24 to move away from the second member 12 along the first direction X and releasing the locked state between the linkage assembly 20 and the second member 12. As the operating member 23 continues to rotate around the rotating direction R, the operating member 23 further drives the rotating member 21 to rotate around the first end 211, causing the first end 211 to detach from the rack 200. An extension direction of the rotational axis S2 of the operating member 23 is the second direction Y. The first direction X, the second direction Y, and the third direction Z are perpendicular to each other. The rotating direction R is a direction in which the side of the operating member 23 facing the first member 11 flips away from the first member 11.

When release the locked state between the linkage assembly 20 and the second member 12, the operating member 23 is flipped around the rotating direction R, driving the locking assembly 24 to move along the first direction X and be detached from the second member 12, a locked state between the operating member 23 and the second member 12 can be released, thereby releasing the locked state between the linkage assembly 20 and the second member 12. The operating member 23 continues to rotate around the rotational axis S2, driving the rotating member 21 to rotate around the rotational axis S1 in the same direction as the operating member 23 (referring to FIG. 3), allowing the first end 211 to detach from the rack 200, achieving a separation of the linkage assembly 20 from the rack 200. Then, a force can be applied to the operating member 23 and rotating member 21 to withdraw the locking mechanism 100 and the device body from the rack 200. Conversely, the device body can be locked onto the rack 200 through the locking mechanism 100 (referring to FIG. 7). When releasing the locked state of the device body and the rack 200 to extract the device body, or locking the device body to the rack 200 and completing the assembly of the device body, a force can be applied to the rotating member 21 after rotating the operating member 23 and no need to change a force-applying component or a force-applying position during the extraction process after releasing the operating member 23. The operational steps can be simplified to extract the device body from the rack 200.

Figure 5:
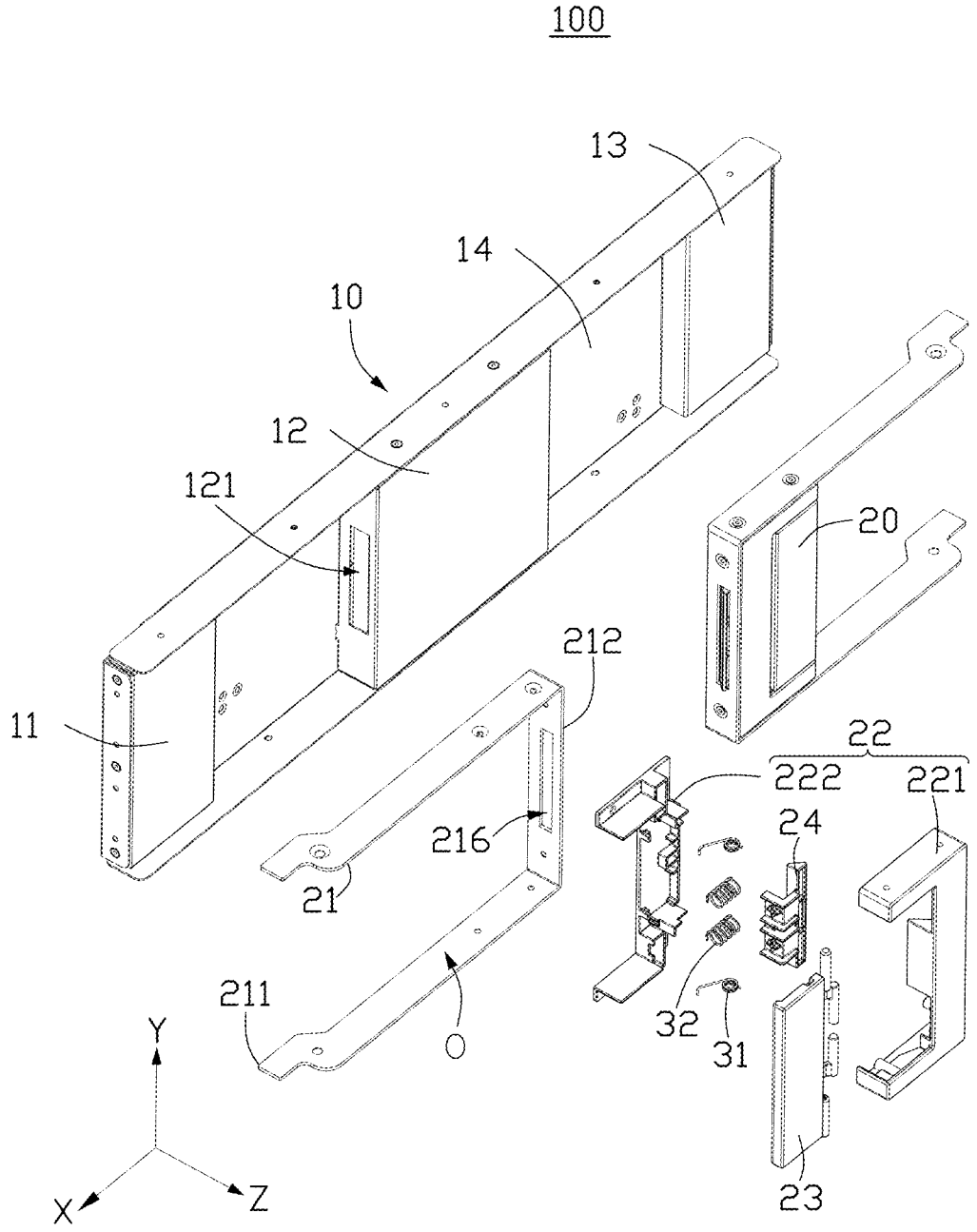
FIG. 5 is an exploded view of the locking mechanism of FIG. 2.
Figure 6:
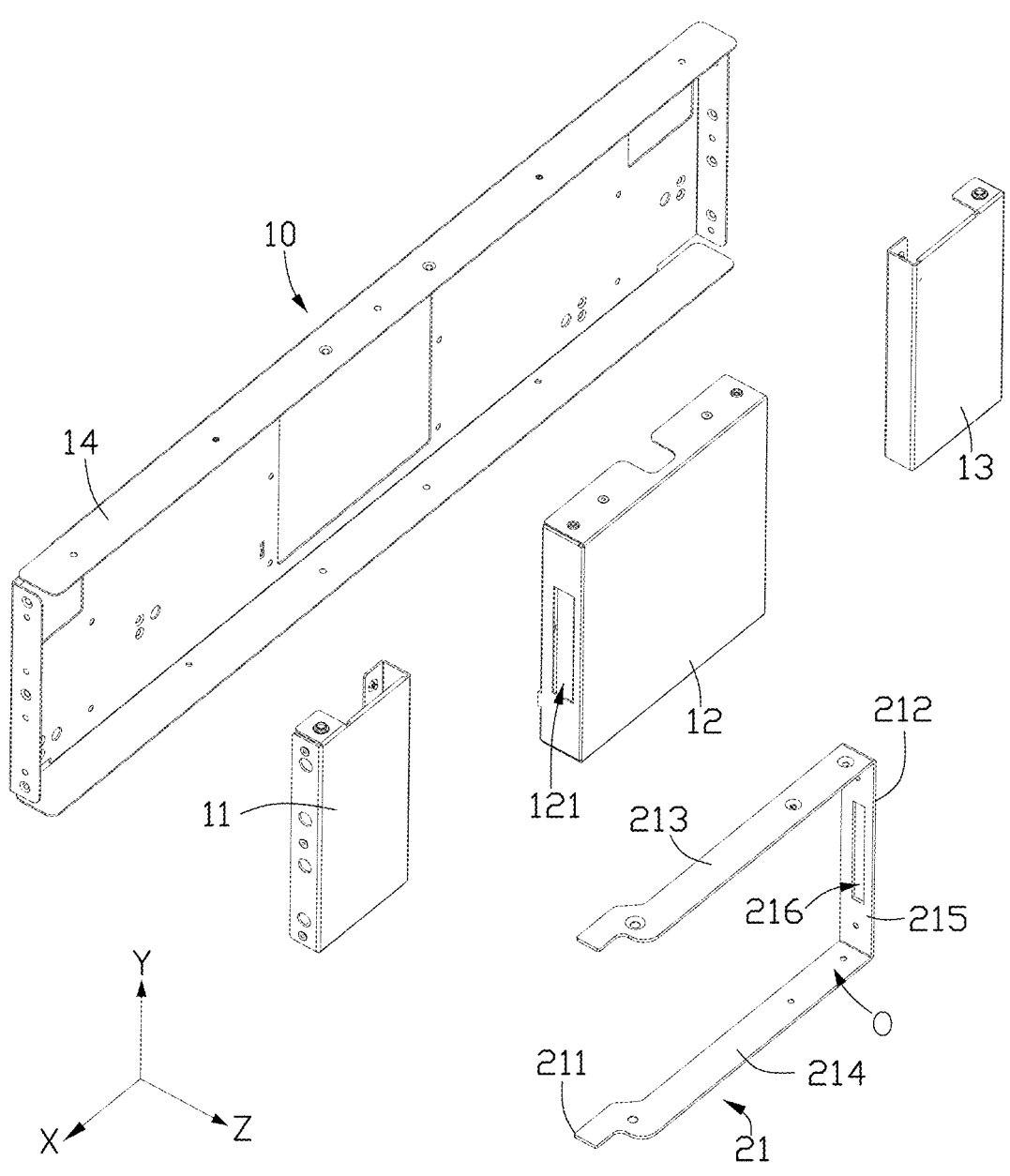
FIG. 6 is an exploded view of a housing of the locking mechanism of FIG. 2.

Referring to FIGS. 5 and 6, in some embodiments, the housing 10 further includes a bottom plate 14. The first member 11 protrudes from the bottom plate 14. The first member 11 and the second member 12 are spaced apart from each other and are disposed on the bottom plate 14.

Referring to FIGS. 3, 4, and 5, in some embodiments, the second member 12 is fixed to the bottom plate 14. A slot 121 is defied on a side of the second member 12 facing the locking assembly 24. The locking assembly 24 is engaged in the slot 121 of the second member 12 to achieve the locking between the rotating member 21 and the second member 12, thereby achieving the linkage assembly 20 locked to the second member 12. The locking assembly 24 can be disengaged from the slot 121 to release the rotating member 21 and the second member 12, thus releasing the locked state between the linkage assembly 20 and the second member 12. In other embodiments, a protruding plate (not shown) can be provided on the second member 12. The protruding plate protrudes from the second member 12. The locking assembly 24 can be engaged with the protruding plate to restrict the locking assembly 24 from disengaging from the second member 12 along the third direction Z. In some embodiments, the second member 12 is substantially a hood-like structure.

Referring to FIGS. 5 and 6, in some embodiments, the rotating member 21 includes a first plate 213, a second plate 214, and a third plate 215. The first plate 213 and the second plate 214 are disposed opposite to each other. The third plate 215 is disposed between the first plate 213 and the second plate 214. The second end 212 is disposed on the third plate 215. Each rotating member 21 includes two first ends 211. The two first ends 211 are disposed at an end of the first plate 213 away from the third plate 215 and an end of the second plate 214 away from the third plate 215. The two first ends 211 are rotatably connected to the first member 11. In some embodiments, the rotating member 21 is rotatably connected to the first member 11 through two insertion axes (not shown) with collinear centers. The first plate 213 and the second plate 214 are inserted between the first plate 213 and the first member 11 by one insertion axis, and another insertion axis is inserted between the second plate 214 and the first member 11, enabling the rotating member 21 to rotate relative to the first member 11.

Figure 7:
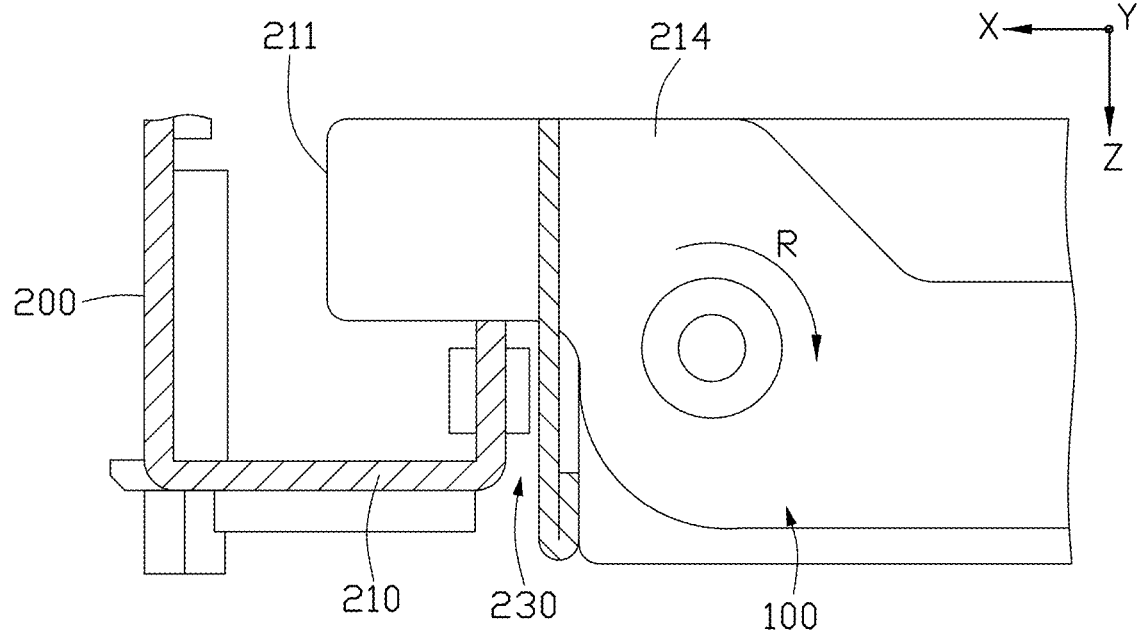
FIG. 7 is a cross-sectional view taken along line VII-VII of FIG. 1.

Referring to FIGS. 2, 3, and 7, in some embodiments, both an end of the first plate 213 and an end of the second plate 214 are extend outward from the bottom plate 14 along the first direction X, that is the first ends 211 protrudes beyond the bottom plate 14. When the locking mechanism 100 is locked on the rack 200, the locking mechanism 100 is clamped with the rack 200 through the first plate 213 and the second plate 214.

Referring to FIGS. 1, 2, and 7, the rack 200 has a cavity 220 with an opening 230. The rack 200 includes a latching plate 210 and the latching plate 210 is disposed at the opening 230. When the housing 10, the device body, and the linkage assembly 20 are accommodated in the cavity 220, the rotating member 21 is rotatably connected to the first member 11 and is parallel to the bottom plate 14 along the first direction X. The first plate 213 and the second plate 214 are restrained on the latching plate 210 along the third direction Z, allowing the linkage assembly 20 to be clamped with the rack 200, thereby locking the device body to the rack 200. In some embodiments, the latching plate 210 is substantially L-shaped.

Referring to FIGS. 1 and 3, when extract the housing 10 and the device body from the rack 200, the operating member 23 is flicked to flip outward, the operating member 23 rotates around the rotation axis S2 around the rotating direction R, causing the locking assembly 24 to move away from the second member 12 along the first direction X and release the locking state between the rotating member 21 and the second member 12, thereby releasing the locking state between the linkage assembly 20 and the second member 12. The operating member 23 continues to rotate around the rotation axis S2 and drives the rotating member 21 to rotate around the rotation axis S1 in the same direction as the operating member 23. The two first ends 211 rotate in a direction gradually away from the latching plate 210 until the end of the first plate 213 and the end of the second plate 214 are no longer restrained by the latching plate 210 along the third direction Z and can be detached from the opening 230 of the rack 200, achieving the separation of the device body from the rack 200. Afterward, the housing 10 and the device body can be extracted from the rack 200 by applying force to the rotating member 21. During releasing the locking assembly 24 and the second member 12, rotating the rotating member 21 can cause the first plate 213 and the second plate 214 to gradually detached from the latching plate 210, thereby the housing 10 and the device body can be removed from the cavity 220 of the rack 200 through the rotating member 21.

Figure 8:
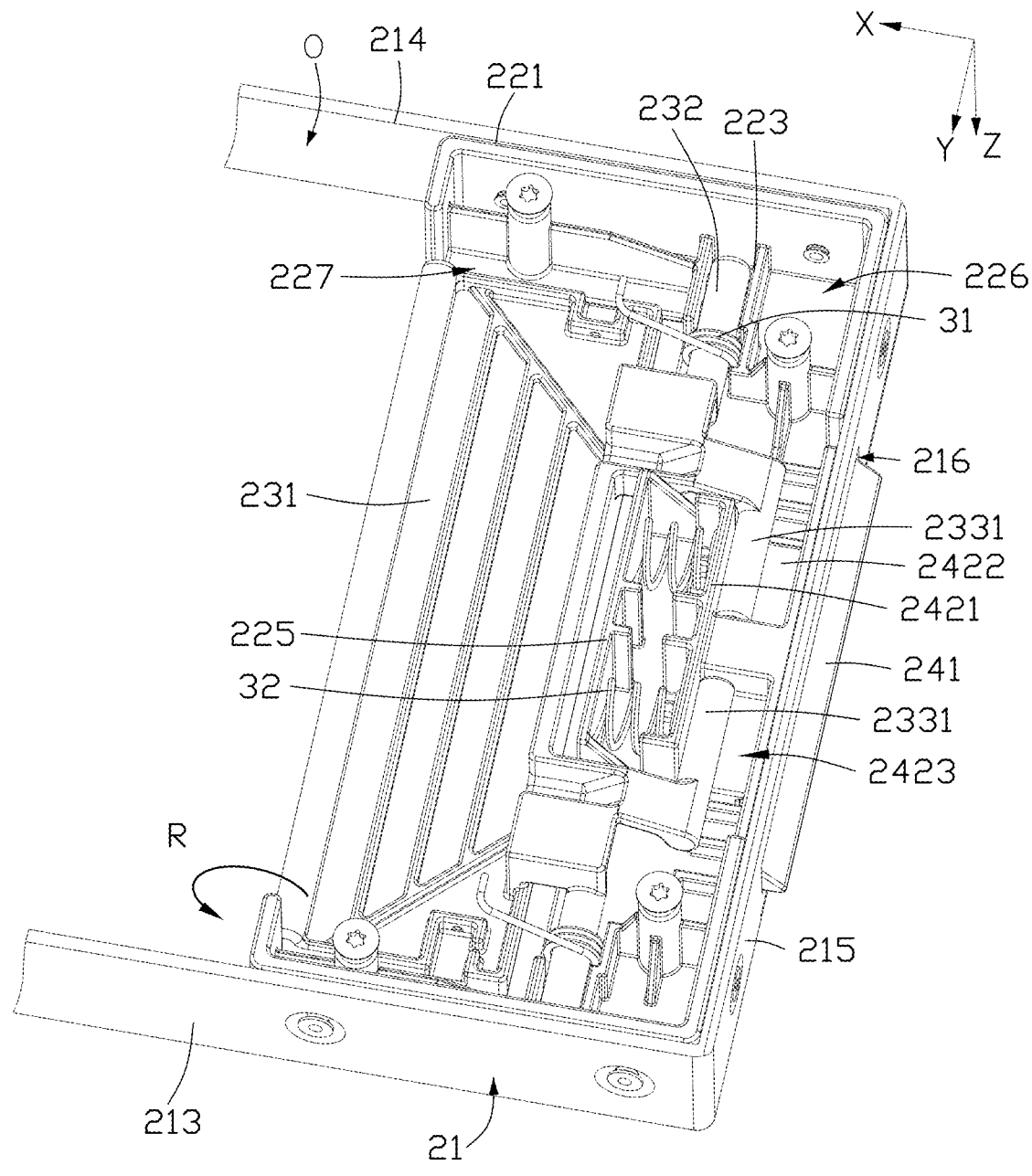
FIG. 8 is a diagrammatic view of an operating member installed on a first fixing portion and a second fixing portion removed of FIG. 2.

Referring to FIGS. 4, 5, and 8, in some embodiments, the fixing member 22 includes a first fixing portion 221 and a second fixing portion 222 opposite to each other. The first fixing portion 221 is fixed to the first plate 213, the second plate 214, and the third plate 215 through rivets or bolts. The first fixing portion 221 and the second fixing portion 222 are detachably connected through snap-fitting or bolts. The fixing member 22 defines a through slot 226. The locking assembly 24 is assembled in the through slot 226 and can move in the through slot 226. The first fixing portion 221 and the second fixing portion 222 cooperatively form the through slot 226.

Figure 9:
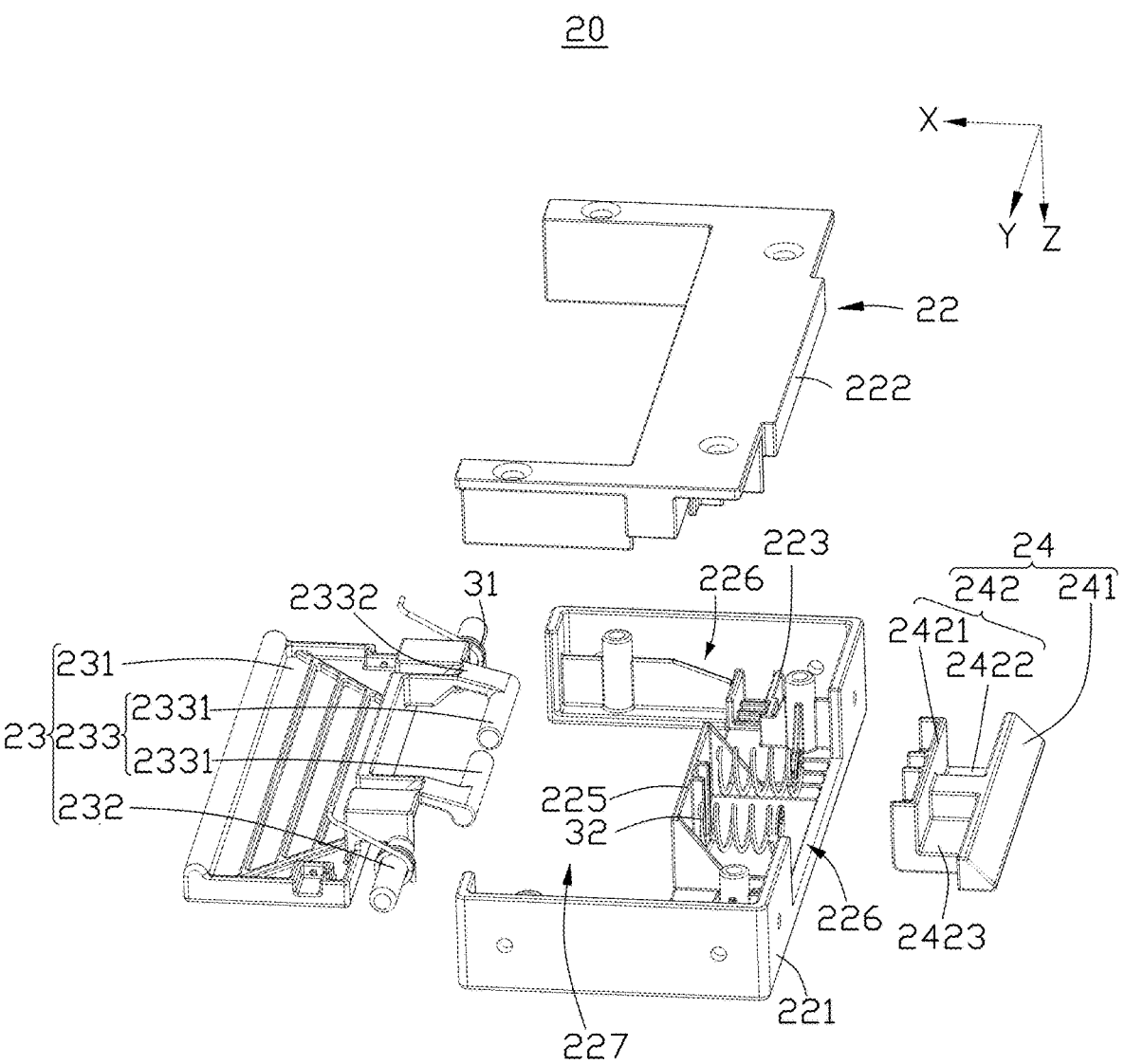
FIG. 9 is an exploded view of a portion of the linkage assembly of FIG. 2.
Figure 10:
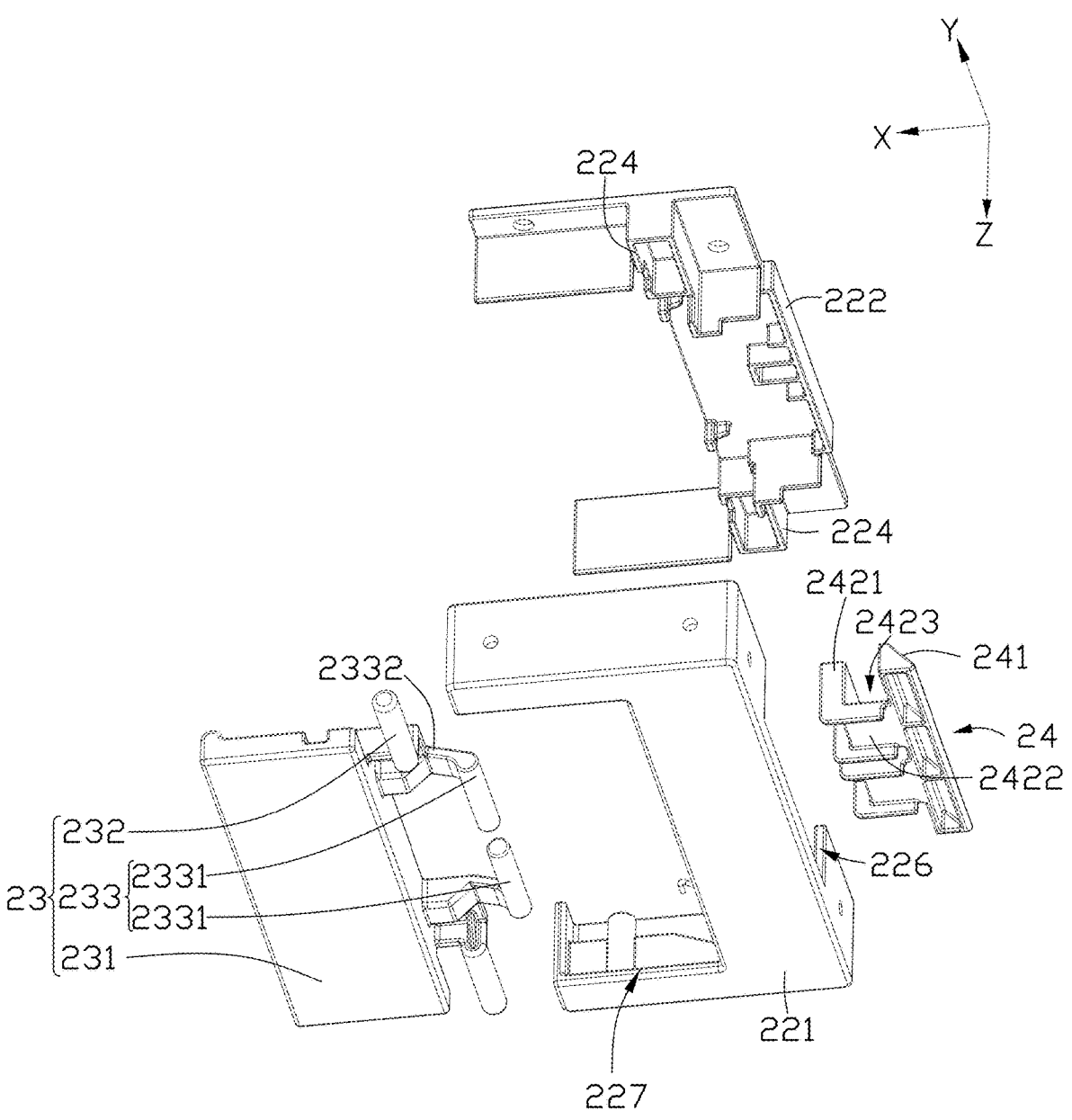
FIG. 10 is similar to FIG. 9, but showing the linkage assembly from another angle.

Referring to FIGS. 9 and 10, in some embodiments, the fixing member 22 further defines an opening slot 227. The opening slot 227 communicates with the accommodating space O. The opening slot 227 is formed on a side of the fixing member 22 away from the third plate 215. The operating member 23 is accommodated in the opening slot 227 and a portion of the operating member 23 extends into the through slot 226 to rotate connected with the fixing member 22. Both the first fixing portion 221 and the second fixing portion 222 are plate-shaped, and both are substantially U-shaped.

Referring to FIGS. 8, 9, and 10, in some embodiments, the operating member 23 includes a gripping portion 231, a rotating shaft 232, and a transmitting portion 233. The rotating shaft 232 protrudes from the gripping portion 231 and is rotatably connected to the fixing member 22. The transmitting portion 233 is disposed on the gripping portion 231 and connected to the locking assembly 24. The operating member 23 drives the locking assembly 24 to move along the first direction X through the transmitting portion 233. As the gripping portion 231 is rotated around the rotating direction R, the transmitting portion 233 drives the locking assembly 24 to move along the first direction X, releasing the locked state between the locking assembly 24 and the second member 12. The gripping portion 231 is accommodated in the opening slot 227. A size of the gripping portion 231 is engaged with a size of the opening slot 227 to minimize an overall volume occupied by the linkage assembly 20. In some embodiments, the gripping portion 231 is substantially a plate shaped. Both the rotating shaft 232 and the transmitting portion 233 are accommodated in the through slot 226. The rotating shaft 232 is disposed between the first fixing portion 221 and the second fixing portion 222 and can rotate relative to the first fixing portion 221 and the second fixing portion 222. The transmitting portion 233 is disposed closer to the locking assembly 24 than the rotating shaft 232 along the first direction X.

Figure 11:
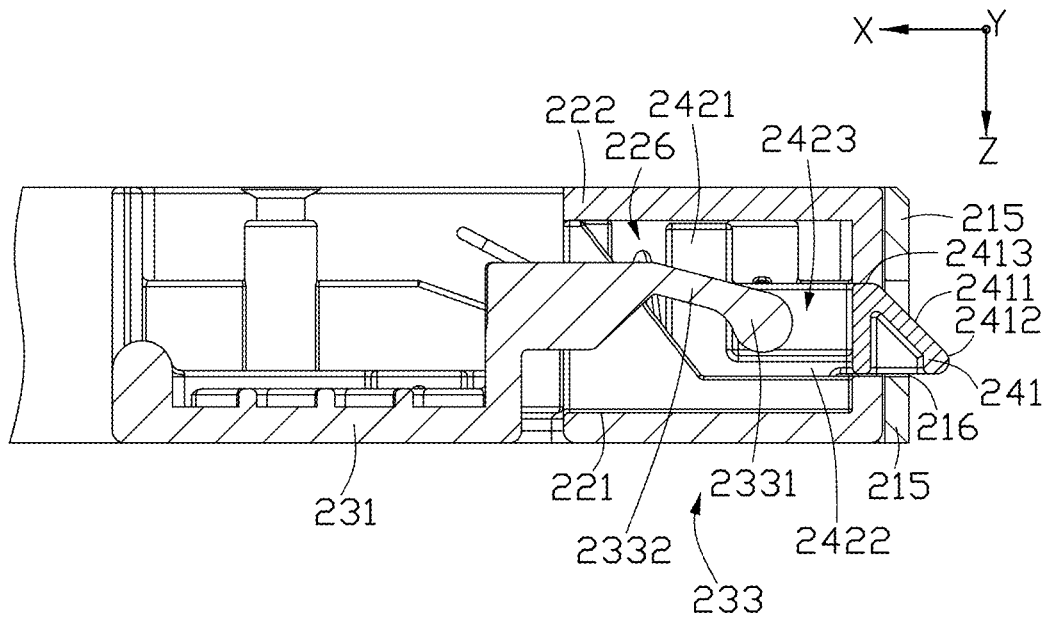
FIG. 11 is a cross-sectional view taken along line XI-XI of FIG. 2.
Figure 12:
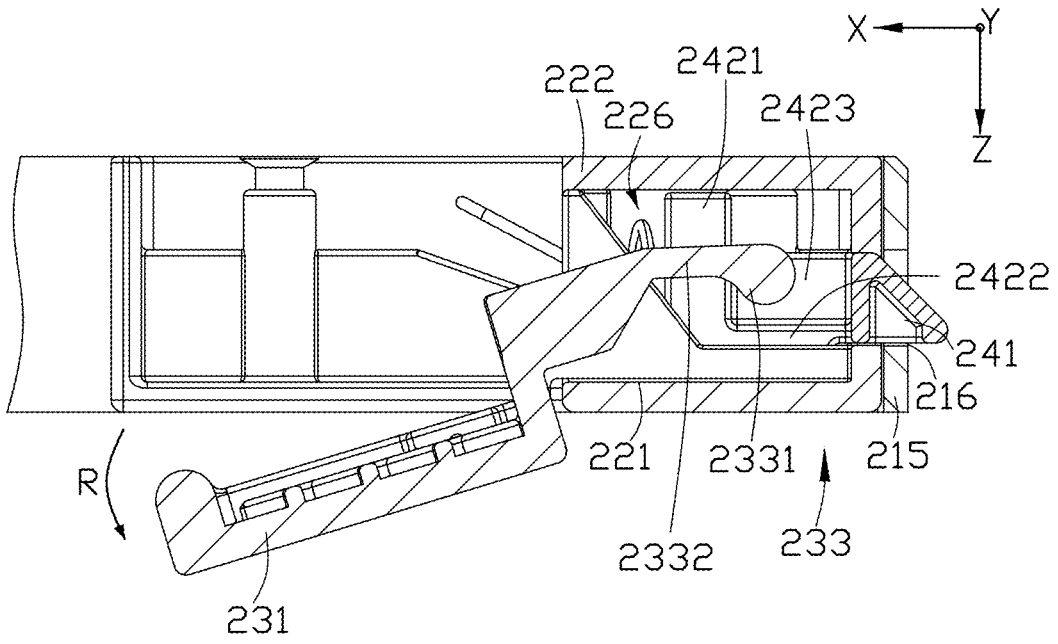
FIG. 12 is a cross-sectional view of the operating member drive a locking assembly to move of FIG. 11.

Referring to FIGS. 11 and 12, a force is applied on the gripping portion 231 to drive the gripping portion 231 rotate around the rotating shaft 232, simultaneously driving the transmitting portion 233 to rotate around the rotating shaft 232 as well. During the rotation, the transmitting portion 233 drives the locking assembly 24 to move along the first direction X. The connection structure is easy to operate, and allows for quick separation of the locking assembly 24 from the second member 12.

Referring to FIGS. 8, 9, and 10, in some embodiments, the locking assembly 24 includes a latch 241 and a connecting portion 242 disposed on a side of the latch 241. The transmitting portion 233 drives the latch 241 to move along the first direction X through the connecting portion 242, thereby causing the latch 241 to disengage from the slot 121 and the locking assembly 24 to detach from the second member 12. The connecting portion 242 is disposed closer to the transmitting portion 233 along the first direction X compared to the latch 241. When releasing the latched state between the locking assembly 24 and the second member 12, the gripping portion 231 is rotated around the rotating direction R. As the transmitting portion 233 abuts against connecting portion 242, the transmitting portion 233 drives the connecting portion 242 to move to translate along the first direction X and detach from the slot 121, thereby releasing the locked state between the latch 241 and the second member 12.

Referring to FIGS. 11 and 12, in some embodiments, the transmitting portion 233 includes two rotating rods 2331 protruding from the gripping portion 231. The two rotating rods 2331 are spaced apart from each other along the second direction Y. The connecting portion 242 includes a first plate 2421 and a second plate 2422. The first plate 2421 is opposite to the latch 241, and the second plate 2422 is disposed between the first plate 2421 and the latch 241. The first plate 2421, the second plate 2422, and the latch 241 cooperatively form an assembling slot 2423. The rotating rods 2331 are accommodated in the assembling slot 2423. When the operating member 23 rotates around the rotating direction R, the operating member 23 drives the rotating rods 2331 to rotate. The rotating rods 2331 abut against the first plate 2421 and drive the first plate 2421 to move along the first direction X, subsequently driving the latch 241 to move along the first direction X and gradually detach from the slot 121 (in FIG. 4). The cooperation between the rotating rods 2331 and the first plate 2421 enables the linkage between the operating member 23 and the locking assembly 24, facilitating the separation and releasing of the locking assembly 24 with the second member 12.

In some embodiments, a connecting rod 2332 is disposed between one rotating rod 2331 and the gripping portion 231. The connecting rod 2332 is connected to one end of the rotating rod 2331, causing a gap between the gripping portion 231 and the rotating rod 2331, allowing the rotating rod 2331 to rotate flexibly.

In some embodiments, a surface of the first plate 2421 facing the rotating rod 2331 is planar. When the rotating rod 2331 contacts and abuts against the first plate 2421, a force is evenly distributed at a contact point between the rotating rod 2331 and the first plate 2421, ensuring a smooth movement of the latch 241 along the first direction X. In some other embodiments, the surface of the first plate 2421 facing the rotating rod 2331 is inclined. The inclined surface slopes along the third direction Z, gradually increasing in distance from the latch 241. Compared to the planar surface, the inclined surface allows the rotating rod 2331 to quickly abut against the first plate 2421 when the operating member 23 is rotated, reducing a rotation angle of the operating member 23.

In some embodiments, along the first direction X, the transmitting portion 233 and the gripping portion 231 are disposed on opposite sides of the rotating shaft 232. Compared to having the transmitting portion 233 and the gripping portion 231 disposed on the same side of the rotating shaft 232, disposing the transmitting portion 233 and the gripping portion 231 on opposite sides of the rotating shaft 232 simplifies a connection relationship between the locking assembly 24 and the transmitting portion 233, and also reduces a space occupied by the first fixing portion 221 and the second fixing portion 222.

In some embodiments, the two rotating rods 2331 are symmetrically disposed along the second direction Y. When the operating member 23 rotates, the two rotating rods 2331 drive the first plate 2421, ensuring a smooth movement of the latch 241 along the first direction X.

Referring to FIGS. 8, 9, and 10, in some embodiments, the locking mechanism 100 further includes a first resetting element 31. The first resetting element 31 is mounted around the rotating shaft 232 and resisted against the fixing member 22. When the operating member 23 is not subjected to external force, the operating member 23 returns to its original position under the action of the first resetting element 31, with the force on the first plate 2421 disappearing. In some embodiments, a first supporting frame 223 is formed on a surface of the first fixing portion 221 facing the second fixing portion 222. A second supporting frame 224 is formed on a surface of the second fixing portion 222 facing the first fixing portion 221. The second supporting frame 224 is engaged with the first supporting frame 223 to form a bearing space. The rotating shaft 232 is accommodated in the bearing space. The first resetting element 31 is confined within the bearing space and fixed to the rotating shaft 232. When a force is applied to the gripping portion 231, the rotating shaft 232 rotates, causing elastic deformation of the first resetting element 31. When the force applied to the gripping portion 231 decreases or disappears, under the elastic force of the first resetting element 31, the first resetting element 31 drives the rotating shaft 232 to return to original position, thereby resetting the operating member 23.

In some embodiments, the first resetting element 31 can be a torsion spring. A free end of the torsion spring is confined between the first supporting frame 223 and the second supporting frame 224. In some embodiments, two rotating shafts 232 are provided, with corresponding first supporting frames 223 and second supporting frames 224, enhancing the stability of the rotating motion of the operating member 23.

In some embodiments, the first fixing portion 221 is provided with a baffle 225 facing the second fixing portion 222. The baffle 225 is disposed between the gripping portion 231 and the first plate 2421. A second resetting element 32 is resisted against the baffle 225 and the locking assembly 24. When a force is applied to the operating member 23, the operating member 23 rotates around the rotating direction R, the locking assembly 24 driven by the first plate 2421 through the transmitting portion 233 moves along the first direction X and compresses the second resetting element 32, the locking assembly 24 unlocks from the slot 121, so that the operating member 23 unlocks from the second member 12, thus releasing the locking state between the linkage assembly 20 and the second member 12. When the force applied on the operating member 23 is removed, the operating member 23 resets under the action of the first resetting element 31, eliminating the force on the first plate 2421 from the transmitting portion 233. Under the elastic force of the second resetting element 32, the second resetting element 32 pushes the first plate 2421 to move along the first direction X, achieving the reset of the locking assembly 24.

In some embodiments, the second resetting element 32 can be a spring, a tension spring, or a torsion spring.

Referring to FIGS. 4, 11, and 12, in some embodiments, the latch 241 has an outer surface. The outer surface includes a first surface 2412, an inclined surface 2411, and a second surface 2413 connected in sequence. The inclined surface 2411 is inclined relative to the first direction X, and the first surface 2412 is away from the first plate 2421 than the second surface 2413. When the latch 241 is clamped in the slot 121, a portion of the latch 241 is exposed from the through hole 216 and gradually extends into the through hole 216 from the second surface 2413 to the first surface 2412, and the latch 241 further extends into the slot 121 when driven by the second resetting element 32.

When assembling the latch 241 into the slot 121, the inclined surface 2411 can guide the latch 241 into the slot 121. When lock the latch 241 in the slot 121, a force is applied to the latch 241 along the third direction Z, the second surface 2413 of the latch 241 first contacts the second member 12 and then slides along the inclined surface 2411. Under the action of the inclined surface 2411, the latch 241 gradually moves along the first direction X and compresses the second resetting element 32 until the third plate 215 of the rotating member 21 is fully adhered to the second member 12, and the latch 241 aligns with the slot 121. With the assistance of the second resetting element 32, the latch 241 extends into the slot 121 along the first direction X, achieving the locking of the locking assembly 24 and the second member 12. During the locking process, the first plate 2421 and the second plate 2422 do not contact the transmitting portion 233. Therefore, the locking of the locking assembly 24 and the second member 12 does not apply force to rotate the operating member 23 allowing the locking of the locking assembly 24 and the second member 12 with minimal force to fix the rotating member 21 to the second member 12 and thus locking the linkage assembly 20 and the second member 12 together.

When assembling the device body to the rack 200 through the linkage assembly 20, the device body is placed in the cavity 220. The first end 211 is disposed towards the second end 212 along the third direction Z. When the device body is fully contained in the cavity 220, the rotating member 21 is rotated towards the first member 11 and gradually brought closer to the first member 11, causing the first plate 213 and the second plate 214 to be clamped with one side of the latching plate 210 and limited along the third direction Z by the latching plate 210. When the latch 241 extends into the slot 121, the rotating member 21 is locked on the second member 12, thereby locking the device body on the rack 200.

Referring to FIGS. 3 and 6, in some embodiments, the housing 10 further includes a third member 13. The second member 12 is disposed between the first member 11 and the third member 13. The locking mechanism 100 includes two linkage assemblies 20. The two linkage assemblies 20 connects to the first member 11 and the third member 13, respectively. A side of the second member 12 facing the linkage assemblies 20 further defines another slot 121. When remove the housing 10 from the rack 200, a force can be applied to at least one of the two linkage assemblies 20, causing the rotating members 21 of the two linkage assemblies 20 to flip in opposite directions, allowing both rotating members 21 to detach from the latching plates 210, enabling the entire housing 10 and the device body to be stably removed from the rack 200.

In some embodiments, the first member 11 and the third member 13 are symmetrically disposed on opposite sides of the second member 12.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A locking mechanism configured to detachably assemble a body to a rack, the locking mechanism comprising:

a housing configured to connect the body, the housing comprising a first member and a second member connected to each other, the first member and the second member disposed along a first direction; and at least one linkage assembly installed on the housing, each of the at least one linkage assembly comprising a rotating member, an operating member, and a locking assembly, the operating member and the locking assembly disposed in the rotating member, the rotating member comprising a first end and a second end opposite to the first end, the first end rotatably connected to the first member and configured to clamped with the rack, the operating member rotatably connected to the second end, the locking assembly mounted on the second end, the second end defining a through hole, the locking assembly configured to extend through the through hole and clamped with the second member, thereby securing the at least one linkage assembly to the rack, wherein a side of the operating member facing the first member is configured to rotate in a direction away from the first member, thereby causing the at least one linkage assembly to move in the first direction away from the second member and be detached from the second member; the operating member is further configured to rotate and drive the rotating member rotate around the first end, thereby causing the first end to detach from the rack.

2. The locking mechanism of claim 1, wherein the operating member comprises a gripping portion, a rotating shaft, and a transmitting portion, the rotating shaft protrudes from the gripping portion and is rotatably connected to the second end, the transmitting portion is disposed on the gripping portion and connected to the locking assembly, and the operating member is configured to drive the locking assembly to move along the first direction through the transmitting portion.

3. The locking mechanism of claim 2, wherein the locking assembly comprises a latch and a connecting portion disposed on a side of the latch, the second member defines a slot, the transmitting portion is configured to drive the latch to move along the first direction through the connecting portion, thereby causing the latch to disengage from the slot and the locking assembly to detach from the second member.

4. The locking mechanism of claim 3, wherein the transmitting portion comprises a rotating rod, the connecting portion comprises a first plate and a second plate, the first plate is opposite to the latch, the second plate is disposed between the first plate and the latch, the first plate, the second plate, and the latch cooperatively form an assembling slot, the rotating rod is accommodated in the assembling slot; when the operating member rotates around the rotating direction, the operating member is configured to drive the rotating rod to rotate, and the rotating rod is configured to abut against the first plate and drive the first plate to move along the first direction.

5. The locking mechanism of claim 2, further comprising a fixing member, wherein the fixing member comprises a first fixing portion and a second fixing portion, the first fixing portion is fixed to the second end, the first fixing portion and the second fixing portion cooperatively form a through slot, the through slot communicates with the accommodating space, the locking assembly is accommodated in the through slot, and the rotating shaft is rotatably disposed between the first fixing portion and the second fixing portion.

6. The locking mechanism of claim 5, further comprising a first resetting element, wherein the first resetting element is mounted around the rotating shaft and resisted against the first fixing portion and the second fixing portion.

7. The locking mechanism of claim 5, further comprising a second resetting element, wherein the first fixing portion is provided with a baffle facing the second fixing portion, the baffle is disposed between the gripping portion and the locking assembly, and the second resetting element is resisted against the baffle and the locking assembly.

8. The locking mechanism of claim 7, wherein the latch comprises an inclined surface, the inclined surface is inclined relative to the first direction, when the latch is clamped in second member, a portion of the latch is exposed from the through hole and extends into the through hole along the inclined surface, and the latch further extends into the second member when driven by the second resetting element.

9. The locking mechanism of claim 1, wherein the housing further comprises a third member, the second member is disposed between the first member and the third member, the at least one linkage assembly comprises two linkage assemblies, one of two linkage assemblies connects to the first member, and another one of the two linkage assemblies connects to the third member.

10. An electronic device module comprising:
a rack; and
at least one electronic device, each of the at least one electronic device comprising a body and a locking mechanism, the body connects to the locking mechanism, the locking mechanism detachably assemble on the rack, wherein:
the locking mechanism comprising:
a locking mechanism configured to detachably assemble a body to a rack, the locking mechanism comprising:
a housing configured to connect the body, the housing comprising a first member and a second member connected to each other, the first member and the second member disposed along a first direction; and
at least one linkage assembly installed on the housing, each of the at least one linkage assembly comprising a rotating member, an operating member, and a locking assembly, the operating member and the locking assembly disposed in the rotating member, the rotating member comprising a first end and a second end opposite to the first end, the first end rotatably connected to the first member and configured to clamped with the rack, the operating member rotatably connected to the second end, the locking assembly mounted on the second end, the second end defining a through hole, the locking assembly configured to extend through the through hole and clamped with the second member, thereby securing the at least one linkage assembly to the rack,
wherein a side of the operating member facing the first member is configured to rotate in a direction away from the first member, thereby causing the at least one linkage assembly to move in the first direction away from the second member and be detached from the second member; the operating member is further configured to rotate and drive the rotating member rotate around the first end, thereby causing the first end to detach from the rack.

11. The electronic device module of claim 10, wherein the operating member comprises a gripping portion, a rotating shaft, and a transmitting portion, the rotating shaft protrudes from the gripping portion and is rotatably connected to the second end, the transmitting portion is disposed on the gripping portion and connected to the locking assembly, and the operating member is configured to drive the locking assembly to move along the first direction through the transmitting portion.

12. The electronic device module of claim 11, wherein the locking assembly comprises a latch and a connecting portion disposed on a side of the latch, the second member defines a slot, the transmitting portion is configured to drive the latch to move along the first direction through the connecting portion, thereby causing the latch to disengage from the slot and the locking assembly to detach from the second member.

13. The electronic device module of claim 12, wherein the transmitting portion comprises a rotating rod, the connecting portion comprises a first plate and a second plate, the first plate is opposite to the latch, the second plate is disposed between the first plate and the latch, the first plate, the second plate, and the latch cooperatively form an assembling slot, the rotating rod is accommodated in the assembling slot; when the operating member rotates around the rotating direction, the operating member is configured to drive the rotating rod to rotate, and the rotating rod is configured to abut against the first plate and drive the first plate to move along the first direction.

14. The electronic device module of claim 11, wherein the locking mechanism further comprises a fixing member, the fixing member comprises a first fixing portion and a second fixing portion, the first fixing portion is fixed to the second end, the first fixing portion and the second fixing portion cooperatively form a through slot, the through slot communicates with the accommodating space, the locking assembly is accommodated in the through slot, and the rotating shaft is rotatably disposed between the first fixing portion and the second fixing portion.

15. The electronic device module of claim 14, wherein the locking mechanism further comprises a first resetting element, wherein the first resetting element is mounted around the rotating shaft and resisted against the first fixing portion and the second fixing portion.

16. The electronic device module of claim 14, wherein the locking mechanism further comprises a second resetting element, wherein the first fixing portion is provided with a baffle facing the second fixing portion, the baffle is disposed between the gripping portion and the locking assembly, and the second resetting element is resisted against the baffle and the locking assembly.

17. The electronic device module of claim 16, wherein the latch comprises an inclined surface, the inclined surface is inclined relative to the first direction, when the latch is clamped in second member, a portion of the latch is exposed from the through hole and extends into the through hole along the inclined surface, and the latch further extends into the second member when driven by the second resetting element.

18. The electronic device module of claim 10, wherein the housing further comprises a third member, the second member is disposed between the first member and the third member, the at least one linkage assembly comprises two linkage assemblies, one of two linkage assemblies connects to the first member, and another one of the two linkage assemblies connects to the third member.

* * * * *